(12) United States Patent
Shiraishi et al.

(10) Patent No.: US 6,564,988 B1
(45) Date of Patent: May 20, 2003

(54) MANUFACTURING METHOD OF HEAD SUSPENSION ASSEMBLY WITH IC CHIP

(75) Inventors: Masashi Shiraishi, Tokyo (JP); Takeshi Wada, Tokyo (JP); Mitsuyoshi Kawai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/565,554

(22) Filed: May 5, 2000

(30) Foreign Application Priority Data

May 24, 1999 (JP) ............................. 11/143414

(51) Int. Cl.[7] .............................. B23K 1/06; B23K 20/10
(52) U.S. Cl. ............................. 228/110.1; 228/180.22; 156/73.1
(58) Field of Search ............................ 228/1.1, 110.1, 228/180.22, 215; 156/73.1

(56) References Cited

U.S. PATENT DOCUMENTS

| | | | |
|---|---|---|---|
| 4,796,132 A | * 1/1989 | Dekura et al. | 360/113 |
| 5,350,629 A | 9/1994 | Chaug et al. | 428/336 |
| 5,715,117 A | 2/1998 | Brooks | 360/104 |
| 5,870,258 A | 2/1999 | Khan et al. | 360/104 |
| 6,038,136 A | * 3/2000 | Weber | 361/783 |
| 6,134,084 A | * 10/2000 | Ohwe et al. | 360/244.1 |
| 6,198,599 B1 | * 3/2001 | Senuma | 360/234.5 |
| 6,202,288 B1 | * 3/2001 | Shiraishi et al. | 29/603.03 |
| 6,266,213 B1 | 7/2001 | Hiraoka | 360/244.1 |
| 6,321,974 B1 | * 11/2001 | Tsuchiya et al. | 228/110.1 |
| 6,369,985 B1 | 4/2002 | Gouo et al. | 360/244.1 |
| 6,382,499 B1 | * 5/2002 | Satoh et al. | 228/173.1 |
| 6,437,450 B1 | * 8/2002 | Baba et al. | 257/778 |

FOREIGN PATENT DOCUMENTS

EP  0 725 389  8/1996

* cited by examiner

Primary Examiner—M. Alexandra Elve
Assistant Examiner—Kevin P. Kerns
(74) Attorney, Agent, or Firm—Oblon, Spivak, McClelland, Maier & Neustadt, P.C.

(57) ABSTRACT

A method of manufacturing a head suspension assembly includes attaching underfill to a portion on which an IC chip with a circuit for a thin-film magnetic head element is to be mounted, disposing the IC chip on the attached underfill, and performing ultrasonic bonding of the IC chip.

20 Claims, 2 Drawing Sheets

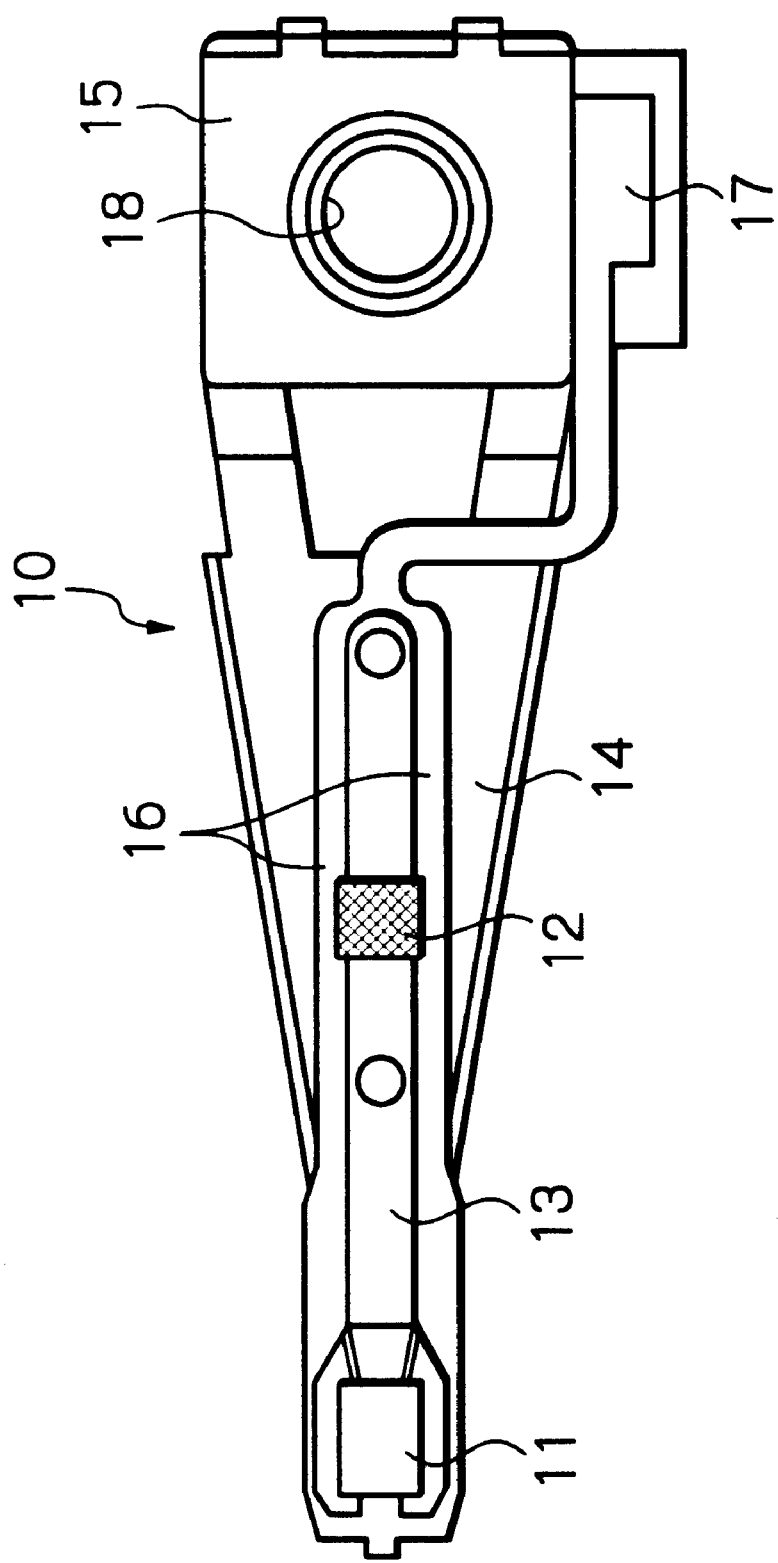

MANUFACTURING METHOD OF HEAD SUSPENSION ASSEMBLY WITH IC CHIP

FIELD OF THE INVENTION

The present invention relates to a method of manufacturing a head suspension assembly used for a magnetic disk device, which includes a slider with at least one thin-film magnetic head element, a resilient suspension for supporting the slider and a head IC chip.

DESCRIPTION OF THE RELATED ART

In such magnetic disk device, the thin-film magnetic head element for writing magnetic information into and/or reading magnetic information from a magnetic disk is in general formed on the slider flying in operation above the rotating magnetic disk. The slider is supported by the suspension made of a resilient thin metal plate extended from one end of each movable arm of the magnetic disk device.

Recently, recording frequency in the magnetic disk has rapidly increased to satisfy the requirement for ever increasing data storage capacities and densities in today's magnetic disk devices. In order to realize higher frequency recording, proposed is a head suspension assembly structure with a suspension for supporting both a slider and a head IC chip of a driver circuit for the magnetic head element. According to this structure, since the length of lead lines from the driver circuit to the magnetic head element can be shortened, generation of unnecessary noises from the lead lines can be effectively suppressed, resulting in an improvement of high frequency recording characteristics.

In fabricating such a magnetic disk device, according a conventional method, each of the head IC chips was mounted on and connected to a connection conductor formed on a suspension by flip chip bonding with a reflow soldering process. Before performing the reflow soldering process, flux was applied to the connection conductor, and then the IC chip with bump balls of solder material was bonded by soldering. More concretely, processes called C4 (Controlled Collapse Chip Connection) including (a) flux applying process, (b) flip chip bonding process, (c) reflow soldering process, (d) cleaning process, (e) dry process, and (f) underfill injection and filling process were sequentially performed.

As will be noted, if the flip chip bonding is performed by reflow soldering using flux, it is necessary to execute the cleaning process after bonding. Namely, in reflow heat bonding, flux is applied to the suspension at a position to which the IC chip is bonded, in order to prompt melting of the solder and temporarily adhere the IC chip to the suspension during reflow soldering. However, since the applied flux may have the adverse effect of producing gas, for example, cleaning has to be done after bonding.

It is desired to fill an underfill into a clearance between the connection conductor on the suspension and the head IC chip to improve heat radiation characteristics, to improve mechanical strength of this area, and to cover a part of the IC chip. However, this filling of the underfill has to be done after the cleaning process. Therefore, according to the conventional fabrication method, after the IC chip had been bonded to the connection conductor on the suspension and then the cleaning process had been finished, the filling of the underfill into the clearance between the connection conductor and the head IC chip was executed by injection.

However, it is very difficult to fill the underfill by injection into the extremely narrow clearance which will be typically 50 $\mu$m or less. Therefore, working time and inspection time become long, causing lead time, which is the processing time of the whole manufacturing process, to increase, and manufacturing cost also increases.

SUMMARY OF THE INVENTION

It is therefore an object of the present invention to provide a method of manufacturing a head suspension assembly, whereby working time and inspection time can be shortened and inspection can be simplified.

Another object of the present invention is to provide a method of manufacturing a head suspension assembly, whereby manufacturing cost can be reduced.

According to the present invention, a method of manufacturing a head suspension assembly includes attaching underfill to a portion on which an IC chip with a circuit for a thin-film magnetic head element is to be mounted, disposing the IC chip on the attached underfill, and performing ultrasonic bonding of the IC chip.

According to the present invention, furthermore, a method of manufacturing a head suspension assembly which has a magnetic head slider with at least one thin-film magnetic head element, a support member for supporting the magnetic head slider, an IC chip with a circuit for the at least one thin-film magnetic head element, a lead conductor member on which the IC chip is bonded, and underfill filled in a clearance between a bottom face of the IC chip and the lead conductor member, is provided. The method includes attaching underfill to a mounting position of the lead conductor member at which position the IC chip is mounted, and thereafter, performing ultrasonic bonding of the IC chip with the lead conductor member.

Since filling of the underfill can be done only by attaching it before bonding of the IC chip, the underfill filling process can be extremely simplified. As a result, working time and inspection time can be shortened and inspection process can be simplified. Thus, manufacturing cost can be reduced.

Due to ultrasonic bonding, it is not necessary to pass the IC chips that are weak from heat stress through a high temperature reflow furnace. Therefore, reliability of finished head suspension assemblies can be improved and also yield of head suspension assemblies can be improved. Furthermore, because no reflow soldering process that requires very long processing time is needed, the working time can be further decreased.

In addition, no reflow soldering results in no cleaning process. The magnetic head slider crosses the surface of the magnetic disk with a very minute crevice between the slider and the magnetic-disk surface. In order to secure the minute crevice, it is very important to maintain a bending angle of each suspension for supporting the slider even after the cleaning process. Since injection or ultrasonic vibration of washing liquid is executed during cleaning process, it is difficult to clean the assemblies without changing the bending angle of the suspensions. However, according to the present invention, since no cleaning process is done, the above-mentioned problems are certainly resolved.

Since there is no reflow soldering, there is no flux application process causing the number of fabricating processes to further reduce.

In reflow soldering it is difficult to correctly control the fused amount of solder and thus the IC chip will freely descend to abut the connection terminals by its own weight. Therefore, according to the conventional method, sufficient stability in bonded size of the assemblies cannot be expected. However, according to the present invention, since ultrasonic bonding is adopted instead of reflow soldering, the stability in bonded size of the assemblies can be greatly improved by controlling energy during the bonding.

As the suspension has a plate spring structure, the bonding face of the suspension inclines against the attachment part of the base plate. In the reflow soldering process, since it is necessary to support to keep the bonding face horizontal in order to obtain effective heat conduction and to melt uniformly the solder bumps of the IC chip, the inclination of the bonding face must be taken into consideration. However, according to the present invention, by adopting ultrasonic bonding, it is necessary that the bonding face of the suspension is horizontal. Therefore, easier bonding of the IC chip can be expected.

It is preferred that the lead conductor member has a first portion formed on the support member and a second portion elongated out of the support member, and that the mounting position is located within the first portion or the second portion of the lead conductor member.

It is also preferred that the method further includes forming of Au or Cu bumps on first connection terminals of the IC chip before the ultrasonic bonding. In this case, the forming of Au or Cu bumps may include forming of Au or Cu bumps on the first connection terminals by using Au or Cu balls.

It is preferred that the method further includes forming of Au or Cu pads as second connection terminals to which the first connection terminals of the IC chip are bonded, before the ultrasonic bonding.

It is also preferred that the method further includes forming of Au or Cu bumps on second connection terminals to which first connection terminals of the IC chip are bonded, before the ultrasonic bonding. In this case, the forming of Au or Cu bumps may include forming of Au or Cu bumps on the second connection terminals by using Au or Cu balls.

It is preferred that the method further includes forming of Au or Cu pads as the first connection terminals of the IC chip before the ultrasonic bonding.

As the size of the head IC chip is very small, bump ball size should be small and a pitch between the bumps should be large when solder balls are adopted and the reflow soldering is executed. However, by using Au or Cu balls according to the present invention, not only the bump size by also the bump pitch may be small. Thus, bumps can be formed very easily. The smaller bump pitch results in high density bumps and therefore the chip size can be more reduced.

In general, if solder contains large quantities of Au, mechanical strength of the bonding lowers. Thus, according to the conventional method adopting the solder balls, the Au layer of the connection terminals in the lead conductor member must be extremely thin. However, by adopting the Au balls instead of the solder balls, the thickness of the Au layer of the connection terminals can be optionally determined.

Furthermore, according to the conventional method adopting the solder balls, there is no means for controlling fused height of the solder bumps and thus the IC chip will descend and tend to incline by its own weight depending upon the bump layout of the IC chip. However, by adopting ultrasonic bonding of Au or Cu balls according to the present invention, it is possible to easily keep the bonding face of the IC chip horizontal and to control the distance between the bottom face of the IC chip and the lead conductor member at a desired value.

It is preferred that the underfill attaching includes dropping the underfill to the mounting position of the lead conductor member. In this case, preferably the dropping of the underfill is executed so that a central part of the attached underfill has a convex form toward the upper part. Since the underfill is dropped to obtain a convex form when the IC chip is placed on the underfill, the clearance between the bottom face of the IC chip and the surface of the lead conductor member is filled with the underfill without forming any cavity.

Further objects and advantages of the present invention will be apparent from the following description of the preferred embodiments of the invention as illustrated in the accompanying drawings.

BRIEF DESCRIPTION OF THE DRAWINGS

FIG. 1 shows a plan view of a preferred embodiment of a head suspension assembly according to the present invention.

DESCRIPTION OF THE PREFERRED EMBODIMENTS

Figure 2A:
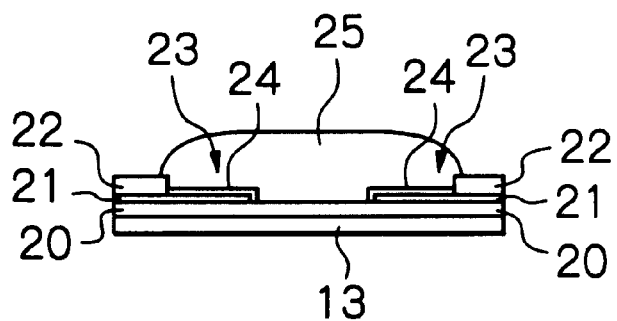
FIGS. 2a to 2d show sectional views illustrating manufacturing processes of the head suspension assembly according to the embodiment shown in FIG. 1.

FIG. 1 schematically illustrates a head suspension assembly as a preferred embodiment of the present invention.

As shown in the figure, a head suspension assembly is assembled by fixing a slider 11 having a thin-film magnetic head element to a top end section of a suspension 10, and by mounting a head IC chip 12 on a middle location of this suspension 10. The slider 11 and the head IC chip 12 are fixed on a surface of the suspension 10, which will oppose to the magnetic disk surface in operation. This surface of the suspension is called hereinafter as a slider-attached surface.

The suspension 10 is substantially constituted by a resilient flexure 13 which carries the slider 11 at its tongue located near its top end section and supports the head IC chip 12 at its middle location, a resilient load beam 14 which supports and fixes the flexure 13, and a base plate 15 formed at a base end section of the load beam 14.

The load beam 14 has elasticity for suppressing the slider 11 toward the direction of a magnetic disk in operation. The flexure 13 has the flexible tongue centered by a dimple formed on the load beam 14 and has elasticity for supporting the slider 11 flexibly by this tongue. As will be noted, in this embodiment, the suspension 10 has a structure composed of three pieces constituted by individual components of the flexure 13, the load beam 14 and the base plate 15. By this structure, stiffness of the flexure 13 is set to be lower than that of the load beam 14.

In the head IC chip 12, an integrated driver circuit constituting a head amplifier of the magnetic head element is formed. Although it is a mere example, the size of the IC chip 12 is 1.0 mm×1.0 mm×0.25 mm. The fixed position of the IC chip 12 on the suspension 10 is in this embodiment determined so as to improve heat radiation characteristics and electromagnetic characteristics and to make mounting of the IC chip easy.

In this embodiment, the flexure 13 is made of a stainless steel plate (for example SUS304TA) with a thickness of about 25 $\mu$m.

A lead conductor layer of a thin-film pattern 16 that constitutes necessary number of lead lines is formed on the flexure 13 along its length. One end of the lead conductor 16

(the base plate 15 side) is connected via the IC chip 12 to connection terminals 17 which will be connected to external circuits, and the other end of the lead conductor 16 is connected to connection terminals for the magnetic head slider 11 formed at the top end section of the flexure 13.

In this embodiment, the load beam 14 is made of a resilient stainless steel plate with a thickness of about 60–65 μm and supports the flexure 13 along its whole length. This load beam 14 has a shape with a width that narrows towards its top end. Fixing of the flexure 13 to the load beam 14 is achieved by means of a plurality of welded spots.

The base plate 15 is made of a stainless steel or iron and is fixed to the base end section of the load beam 14 by welding. The suspension 10 will be attached to each movable arm (not shown) by fixing an attachment part 18 of the base plate 15 to the movable arm.

In modification, the suspension may be formed in a two-piece structure with a base plate and a flexure-load beam instead of the three-piece structure with the flexure 13, the load beam 14 and the base plate 15.

As aforementioned, the slider 11 with the magnetic head element is mounted on the tongue of the flexure 13 at the top end section of the suspension 10. The lead conductor layer 16 which includes the necessary number of lead lines passes both sides of the slider 11 and turns back at the top end section of the flexure 13 to the connection terminals so as to be electrically connected with input/output electrodes of the slider 11. The insulation material layer made of the resin covers the connected part.

The head IC chip 12 is mounted on the slider-attached surface at the middle length location of the suspension 10. The IC chip 12 in this embodiment is formed by a bear chip and mounted on and connected to the connection pads formed on the way of the lead conductor layer 16 that is formed on the flexure 13 of the suspension 10 via an insulation material layer. An underfill is filled in a clearance between the bottom surface of the IC chip 12 and the lead conductor layer so as to improve heat radiation characteristics, to improve mechanical strength of this area, and to cover a part of the IC chip 12.

Hereinafter, bonding of the IC chip 12 and filling of the underfill according to the present invention will be described with reference to FIGS. 2a to 2d.

As shown in FIG. 2a, on the flexure 13 made of stainless steel plate, the thin-film conductive pattern is formed by a well-known method similar to the patterning method of forming a printed circuit board on a thin metal plate such as a flexible printed circuit (FPC). For example, the conductive pattern is formed by sequentially depositing a first insulation material layer 20 made of a resin such as polyimide with a thickness of about 5 μm, a patterned Cu layer (conductive layer) 21 with a thickness of about 4 μm, and a second insulation material layer 22 made of a resin such as polyimide with a thickness of about 5 μm on the flexure 13 in this order. Within the regions of the connection terminals to the magnetic head slider and to the external circuit and also connection pads 23 to the IC chip 12, and Au layer 24 is deposited on the Cu layer 21 and there is no second insulation material layer on the Au layer 24.

Then, as shown in FIG. 2a, an underfill 25 in the liquid state for improving heat radiation characteristics, improving mechanical strength of this area, and covering a part of the IC chip 12 is dropped on and attached to a portion around the connection pads 23 of the thin-film conductive pattern. The underfill 25 is a good heat conductivity material made of, for example, a mixture of a resin such as epoxy resin and an insulation material with good heat conductivity. It is desired that the central part of the attached underfill 25 have a convex form toward the upper part. Due to the convex form of the attached underfill, no cavity remains in the clearance between the bottom face of the IC chip 12 and the thin-film conductive pattern with the IC chip 12 is disposed on the underfill 25 and pushed down.

The underfill resin with good heat conductivity composing the underfill layer 25 may be, for example, a resin such as epoxy resin containing fused silica (heat conductivity ratio of about $12 \times 10^{-4}$ cal/cm sec degrees), a resin containing alumina (heat conductivity ratio of about $40 \times 10^{-4}$ cal/cm sec degrees), a resin containing crystal silica (heat conductivity ratio of about $35 \times 10^{-4}$ cal/cm sec degrees), or a resin containing aluminum nitride (heat conductivity ratio of about $40 \times 10^{-4}$ cal/cm sec degrees).

Figure 2B:
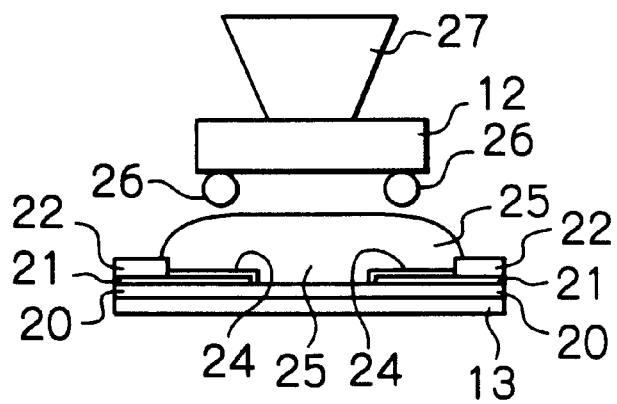

As shown in FIG. 2b, bumps 26 of Au balls are preliminarily made on connection pads (not shown) formed on the bottom face of the IC chip 12. This IC chip 12 is picked up by a ultrasonic bonding head 27 that is abutted to the top face of the IC chip as shown in FIG. 2b, and aligned with the connection pads 23 of the thin-film conductive pattern.

Figure 2C:
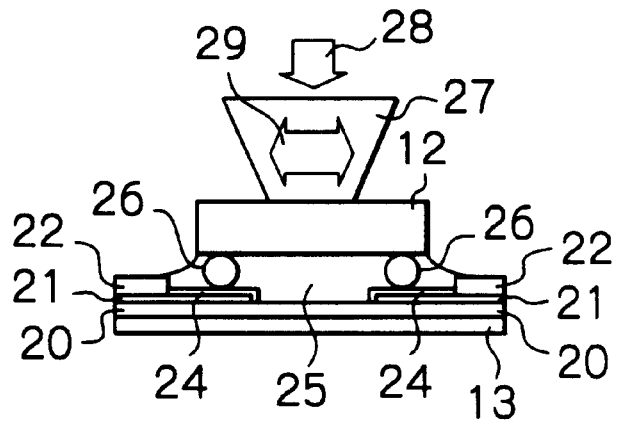

Then, as shown in FIG. 2c, the IC chip 12 is depressed toward a direction of an arrow 28 to squeeze the attached underfill 25 until the Au ball bumps 26 of the IC chip 12 abut the connection pads 23 of the thin-film conductive pattern. Also, ultrasonic vibration is applied from the ultrasonic head 27 in the direction shown by arrow 29.

The depression with a constant pressure (load) and the application of ultrasonic vibration cause fused bonding of the Au ball bumps 26 of the IC chip 12 with the Au layer 24 of the connection pads 23.

Figure 2D:
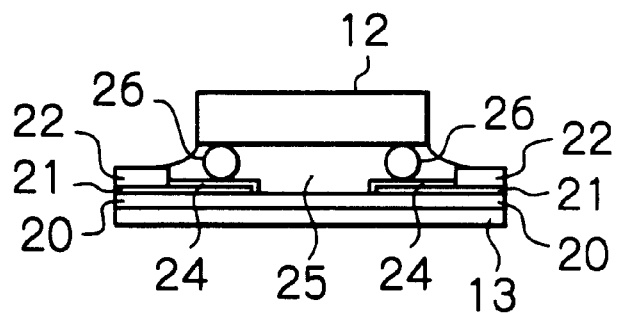

Thus, as shown in FIG. 2d, not only is connection between connection terminals of the IC chip 12 and the connection pads 23 achieved, but the clearance between the bottom face of the IC chip 12 and the surface of the thin-film conductive pattern is also completely filled with the underfill 25 without forming any cavity. The underfill 25 is cured during a heat and dry process executed later. Since the underfill 25 is dropped so as to have a convex form and the IC chip 12 depresses the underfill 25, the clearance between the bottom face of the IC chip 12 and the surface of the thin-film conductive pattern is completely filled with the underfill 25 without forming any cavity.

According to the embodiment, since the Au ball bumps 26 of the IC chip 12 with the Au layer 24 of the connection pads 23 are electrically and mechanically bonded by ultrasonic fused bonding, neither temporal fixing of the IC chip nor reflow soldering is required. Furthermore, since ultrasonic and compression bonding is done, the filling process of the underfill 25 can be performed before the IC chip bonding. As mentioned before, in the conventional method, filling of the underfill is possible only after the reflow soldering and cleaning processes are finished. Therefore, difficult filling of the underfill by injection has to be performed and re-heating after the reflow soldering process is required. Furthermore, available underfill material is restricted to shorten a machine process time. However, according to this embodiment, since ultrasonic bonding using the Au ball bumps is adopted, it is possible to attach the underfill to a portion of a suspension on which an IC chip is bonded, and to dry the underfill by heating after the IC chip is bonded. Thus, the flexibility of the resin selection for the underfill and a process design increases, and a marked decrease of the machine processing time can be expected.

In addition, according to the embodiment, no transfer process of solder flux and also reflow soldering process are needed. Therefore, no cleaning process is needed. Furthermore, since it is possible to fill the underfill before bonding of the IC chip, the underfill filling process can be extremely simplified. As a result, the machine processing time may be extremely shortened, and quality of the fabricated head suspension assembly may be greatly improved.

In the aforementioned embodiment, the Au ball bumps 26 of the IC chip 12 and the Au layer 24 of the connection pads 23 are bonded by ultrasonic bonding. However, the present invention can be achieved by ultrasonic bonding using Cu balls and a Cu layer or using another type of metal balls and another metal layer instead of the Au balls and the Au layer. In another modification, the bumps may be formed on the connection pads of the thin-film conductive pattern.

Many widely different embodiments of the present invention may be constructed without departing from the spirit and scope of the present invention. It should be understood that the present invention is not limited to the specific embodiments described in the specification.

What is claimed is:

1. A method of manufacturing a head suspension assembly comprising the steps of:

attaching underfill to a mounting portion on which an IC chip with a circuit for a thin-film magnetic head element is to be mounted;

disposing said IC chip on the attached underfill; and performing ultrasonic bonding of said IC chip.

2. The method as claimed in claim 1, wherein said method further includes the step of forming Au or Cu bumps on first connection terminals of said IC chip before said ultrasonic bonding.

3. The method as claimed in claim 2, wherein said forming step of Au or Cu bumps includes forming Au or Cu bumps on said first connection terminals by using Au or Cu balls.

4. The method as claimed in claim 2, wherein said method further includes the step of forming Au or Cu pads as second connection terminals to which said first connection terminals of said IC chip are bonded, before said ultrasonic bonding.

5. The method as claimed in claim 1, wherein said method further includes the step of forming Au or Cu bumps on second connection terminals to which first connection terminals of said IC chip are bonded, before said ultrasonic bonding.

6. The method as claimed in claim 5, wherein said forming step of Au or Cu bumps includes forming Au or Cu bumps on said second connection terminals by using Au or Cu balls.

7. The method as claimed in claim 5, wherein said method further includes the step of forming Au or Cu pads as said first connection terminals of said IC chip before said ultrasonic bonding.

8. The method as claimed in claim 1, wherein said underfill attaching step includes dropping the underfill to a position of said mounting portion on which said IC chip is to be mounted.

9. The method as claimed in claim 8, wherein said dropping of the underfill is executed so that a central part of an attached underfill has a convex form toward an upper part.

10. A method of manufacturing a head suspension assembly which includes a magnetic head slider with at least one thin-film magnetic head element, a support member for supporting said magnetic head slider, an IC chip with a circuit for said at least one thin-film magnetic head element, a lead conductor member on which said IC chip is bonded, and underfill filled in a clearance between a bottom face of said IC chip and said lead conductor member, said method comprising the steps of:

attaching underfill to a mounting position of said lead conductor member, at which position said IC chip is mounted; and thereafter, performing ultrasonic bonding of said IC chip with said lead conductor member.

11. The method as claimed in claim 10, wherein said lead conductor member has a first portion formed on said support member and a second portion elongated out of said support member, and wherein said mounting position is located within said first portion of said lead conductor member.

12. The method as claimed in claim 10, wherein said lead conductor member has a first portion formed on said support member and a second portion elongated out of said support member, and wherein said mounting position is located within said second portion of said lead conductor member.

13. The method as claimed in claim 10, wherein said method further includes the step of forming Au or Cu bumps on first connection terminals of said IC chip before said ultrasonic bonding.

14. The method as claimed in claim 13, wherein said forming step of Au or Cu bumps includes forming Au or Cu bumps on said first connection terminals by using Au or Cu balls.

15. The method as claimed in claim 13, wherein said method further includes the step of forming Au or Cu pads as second connection terminals to which said first connection terminals of said IC chip are bonded, before said ultrasonic bonding.

16. The method as claimed in claim 10, wherein said method further includes the step of forming Au or Cu bumps on second connection terminals to which first connection terminals of said IC chip are bonded, before said ultrasonic bonding.

17. The method as claimed in claim 16, wherein said forming step of Au or Cu bumps includes forming Au or Cu bumps on said second connection terminals by using Au or Cu balls.

18. The method as claimed in claim 16, wherein said method further includes the step of forming Au or Cu pads as said first connection terminals of said IC chip before said ultrasonic bonding.

19. The method as claimed in claim 10, wherein said underfill attaching step includes dropping the underfill to said mounting position of said lead conductor member.

20. The method as claimed in claim 19, wherein said dropping of the underfill is executed so that a central part of the attached underfill has a convex form toward an upper part.

* * * * *